United States Patent
Xiao et al.

(10) Patent No.: US 8,305,240 B2
(45) Date of Patent: Nov. 6, 2012

(54) INPUT INDUCING DEVICE AND INDUCING KEYBOARD

(75) Inventors: Jin-Wei Xiao, Shenzhen (CN); Jun Gu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 299 days.

(21) Appl. No.: 12/817,213

(22) Filed: Jun. 17, 2010

(65) Prior Publication Data

US 2011/0291864 A1 Dec. 1, 2011

(30) Foreign Application Priority Data

May 25, 2010 (CN) .......................... 2010 1 0182067

(51) Int. Cl.
*H03K 17/94* (2006.01)
*H03M 11/00* (2006.01)

(52) U.S. Cl. ............................. 341/22; 341/20; 345/173

(58) Field of Classification Search .................... 341/20, 341/22; 345/173
See application file for complete search history.

(56) References Cited

U.S. PATENT DOCUMENTS

| | | | |
|---|---|---|---|
| 6,288,710 B1 * | 9/2001 | Lee et al. | 345/173 |
| 7,084,933 B2 * | 8/2006 | Oh et al. | 349/12 |
| 7,804,860 B2 * | 9/2010 | Kim et al. | 370/537 |
| 7,843,439 B2 * | 11/2010 | Perski et al. | 345/173 |

* cited by examiner

*Primary Examiner* — Khai M Nguyen
(74) *Attorney, Agent, or Firm* — Altis Law Group, Inc.

(57) ABSTRACT

An input inducing device is provided. The input inducing device includes a winding, a current sensor, and a processing unit. Two ends of the winding are connected to the current sensor and form a closed-loop with the current sensor. When a magnetic object moves towards the winding, the winding cuts magnetic induction lines of the magnetic object to generate an induced current, the current sensor senses the induced current and generates a sensing signal according to the sensed induced current. The sensing signal is transmitted to the processing unit, which then implements a predetermined function according to the sensing signal.

11 Claims, 2 Drawing Sheets

INPUT INDUCING DEVICE AND INDUCING KEYBOARD

BACKGROUND

1. Technical Field

The present disclosure relates to an input inducing device and an inducing keyboard.

2. Description of Related Art

The commonly used input device such as a keyboard is operated by pressing buttons. However, the buttons of the keyboard are easily damaged because of the repeated and long time pressing.

BRIEF DESCRIPTION OF THE DRAWINGS

The components of the drawings are not necessarily drawn to scale, the emphasis instead being placed upon clearly illustrating the principles of the inducing input device and the inducing keyboard. Moreover, in the drawings, like reference numerals designate corresponding parts throughout several views.

DETAILED DESCRIPTION

Figure 1:
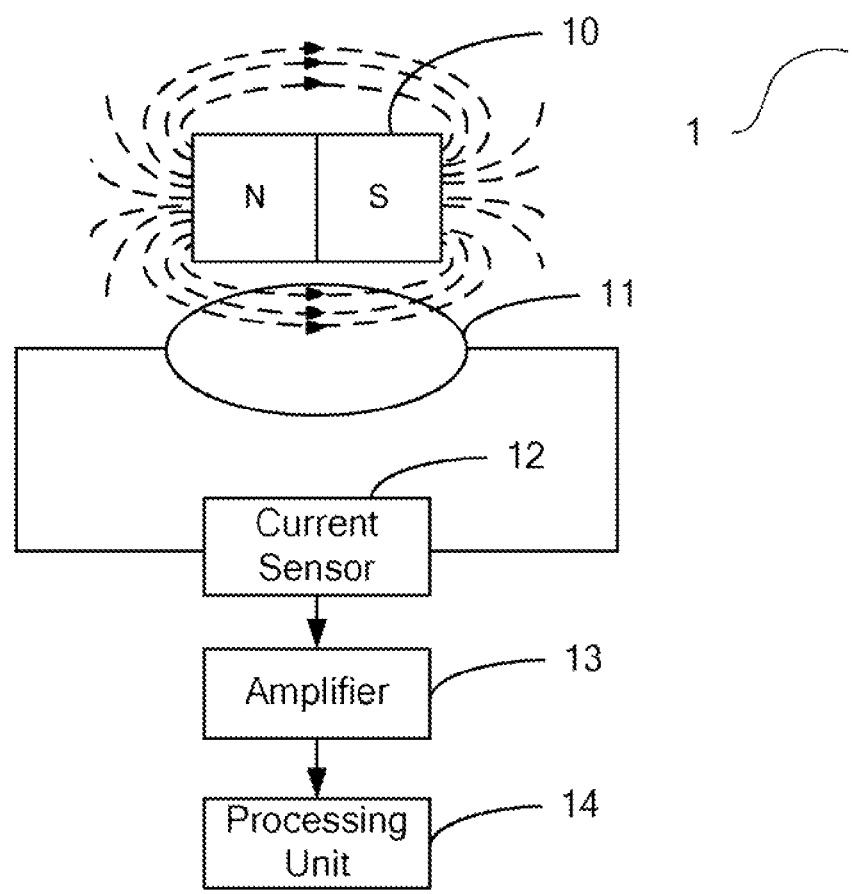
FIG. 1 is a circuit diagram of an input inducing device in accordance with an exemplary embodiment.

FIG. 1 is a circuit diagram of an input inducing device 1 in accordance with an exemplary embodiment. The input inducing device 1 includes a winding 11, a current sensor 12, an amplifier 13, and a processing unit 14. Two ends of the winding 11 are connected to the current sensor 12 and form a closed-loop with the current sensor 12. In this preferred embodiment, the winding 11 is taken as a button of the input inducing device 1. In order to be operated conveniently, the winding 11 can be fixed to a carrier (not shown). The winding 11 receives an input of a magnetic object 10. The winding 11 cuts the magnetic induction lines of the magnetic object 10 to generate an induced current when the magnetic object 10 moves towards the winding 11. The current sensor 12 senses the induced current and generates a sensing signal according to the sensed induced current. After magnified by the amplifier 13, the sensing signal is transmitted to the processing unit 14. The processing unit 14 implements a predetermined function according to the sensing signal. The magnetic object 10 can be a magnetic pen or a magnetic finger cover that covers the finger of the user. In this preferred embodiment, in order to make the winding 11 cut the magnetic induction lines of the magnetic object 10 as much as possible, the winding 11 can be designed in a substantially swirl shape.

Due to the electromagnetic induction theory, the magnetic object 11 moves towards and away from the winding 11 which will generate induced current with reverse direction. Therefore, in this preferred embodiment, the current sensor 12 further detects the direction of the induced current and generates different sensing signal according to different direction of the induced current. The processing unit 14 implements different function according to different sensing signal. If the input inducing device 1 implements only one function, the current sensor 12 senses the induced current only in a predetermined direction.

Figure 2:
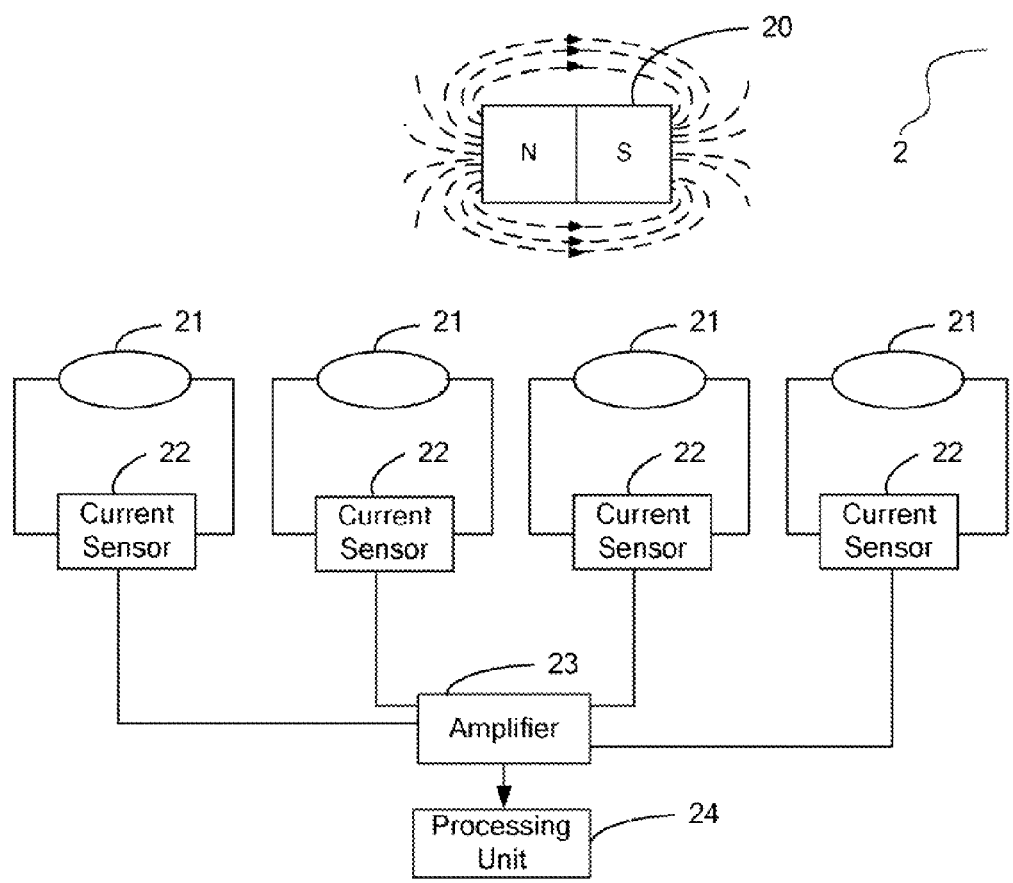
FIG. 2 is a circuit diagram of an inducing keyboard in accordance with another exemplary embodiment.

FIG. 2 is a circuit diagram of an inducing keyboard 2 in accordance with another exemplary embodiment. The keyboard 2 includes a plurality of windings 21. The windings 21 are taken as buttons of the keyboard 2. All the windings 21 are arrayed according to keyboard input matrix. Two ends of each winding 21 are connected to a current sensor 22 and form a closed-loop with the current sensor 22. All the current sensors 22 are connected to an amplifier 23. The amplifier 23 is connected to a processing unit 24. In order to be operated conveniently, the windings 21 can be fixed to a carrier (not shown).

The windings 21 receive inputs of a magnetic object 20, when the magnetic object 20 moves towards one of the windings 21, the windings 21 cut magnetic induction lines of the magnetic object 20 to generate an induced current. The corresponding current sensor 22 of the winding 21 senses the induced current and generates a sensing signal according to the sensed induced current. After being amplified by the amplifier 23, the sensing signal is transmitted to the processing unit 24. The processing unit 24 determines the position of the winding 21 that generates the induced current in the keyboard input matrix and implements a function predetermined for the position of the winding 21. In this preferred embodiment, the current sensor 22 only generates a sensing signal when the magnetic object move towards the windings 21.

Although the present disclosure has been specifically described on the basis of preferred embodiments, the disclosure is not to be construed as being limited thereto. Various changes or modifications may be made to the embodiment without departing from the scope and spirit of the disclosure.

What is claimed is:

1. An input inducing device comprising:
   a winding;
   a current sensor, two ends of the winding being connected to the current sensor and forming a closed-loop with the current sensor, wherein the winding cuts magnetic induction lines of a magnetic object to generate an induced current when the magnetic object moves towards the winding, the current sensor senses the induced current, generates a sensing signal according to the sensed induced current, detects the direction of the induced current, and generates different sensing signal according to different direction of the induced current; and
   a processing unit implementing different function according to the different sensing signal transmitted from the current sensor.

2. The inducing input device as described in claim 1, further comprising an amplifier, the amplifier being connecting between the current sensor and the processing unit, before being transmitted to the processing unit, the sensing signal being amplified by the amplifier.

3. The inducing input device as described in claim 1, wherein the winding is fixed to a carrier.

4. The inducing input device as described in claim 1, wherein the magnetic object is a magnetic pen or a magnetic finger cover that covers the finger of the user.

5. The inducing input device as described in claim 1, wherein the winding is designed in a substantially swirl shape.

6. An inducing keyboard comprising:
   a plurality of windings being arrayed according to a keyboard input matrix and each of the plurality of winding being taken as a button of a keyboard;
   a plurality of current sensors, two ends of each winding being connected to one current sensor and forming a closed-loop with the current sensor; and
   a processing unit, all the current sensors being connected to the processing unit;

when a magnetic object moves towards one of the windings, the winding cutting magnetic induction lines of the magnetic object to generate an induced current, the corresponding current sensor sensing the induced current and generating a sensing signal according to the sensed induced current, the sensing signal being transmitted to the processing unit, the processing unit determining the position of the winding that generates the induced current in the keyboard input matrix and implements a function predetermined for the position of the winding.

7. The inducing keyboard as described in claim 6, further comprising an amplifier, the amplifier being connecting between current sensors and the processing unit, before transmitted to the processing unit, the sensing signal being amplified by the amplifier.

8. The inducing keyboard as described in claim 6, wherein the windings are fixed to a carrier.

9. The inducing keyboard as described in claim 6, wherein the magnetic object is a magnetic pen or a magnetic finger cover that covers the finger of the user.

10. The inducing keyboard as described in claim 6, wherein each winding is designed in a substantially swirl shape.

11. The inducing keyboard as described in claim 6, wherein the current sensor generates sensing signal when the magnetic object move towards the winding.

* * * * *